United States Patent [19]
Hohn et al.

[11] Patent Number: 5,150,392
[45] Date of Patent: Sep. 22, 1992

[54] X-RAY MASK CONTAINING A CANTILEVERED TIP FOR GAP CONTROL AND ALIGNMENT

[75] Inventors: Fritz J. Hohn, Somers; Mark A. McCord, Mohegan Lake, both of N.Y.

[73] Assignee: International Business Machines Corporation, Armonk, N.Y.

[21] Appl. No.: 756,642

[22] Filed: Sep. 9, 1991

[51] Int. Cl.$^5$ .............................................. G21K 5/00
[52] U.S. Cl. ........................................ 378/34; 378/35; 378/205; 378/208; 378/163; 250/306; 250/309; 250/311; 250/492.2; 250/491.1
[58] Field of Search ................... 378/34, 35, 205, 208, 378/163; 250/306, 307, 309, 311, 491.1, 942.2, 423 F

[56] References Cited

U.S. PATENT DOCUMENTS

| | | | |
|---|---|---|---|
| Re. 33,387 | 10/1990 | Binnig | 250/306 |
| 3,876,879 | 4/1975 | McAdams et al. | 250/307 |
| 4,343,993 | 9/1980 | Binning et al. | 250/306 |
| 4,359,892 | 11/1982 | Schnell et al. | 73/105 |
| 4,516,326 | 5/1985 | Calcagno | 33/169 B |
| 4,560,880 | 12/1985 | Petric et al. | 250/441.1 |
| 4,592,081 | 5/1986 | Eaton et al. | 378/34 |
| 4,679,326 | 7/1987 | Takizawa et al. | 33/170 |
| 4,762,996 | 8/1988 | Binning et al. | 250/306 |
| 4,785,189 | 11/1988 | Wells | 250/492.2 |
| 4,806,755 | 2/1989 | Duerig et al. | 250/306 |
| 4,870,668 | 9/1989 | Frankel et al. | 378/34 |
| 4,874,945 | 10/1989 | Ohi | 250/306 |
| 4,943,719 | 7/1990 | Akamine et al. | 250/306 |
| 4,979,195 | 12/1990 | Tabata et al. | 378/34 |
| 4,992,728 | 2/1991 | McCord et al. | 250/306 |

Primary Examiner—Janice A. Howell
Assistant Examiner—Kim-Kwok Chu
Attorney, Agent, or Firm—John J. Goodwin

[57] ABSTRACT

An X-ray mask membrane 12 is discussed wherein a cantilever and tip portion such as used on an atomic force or scanning tunneling microscope are fabricated directly as part of the mask. The mask is located over a wafer and the vertical (z) motion of the tip with respect to the wafer is achieved with a piezoelectric device which is mounted on a movable support above the cantilever. Piezoelectric device may be a tube having an electrode divided into quadrants so that the end of the tube could be positioned in three dimensions to allow for alignment of the end of the tube to the cantilever tip. X and Y motion of the tip and the mask membrane relative to the wafer is achieved by mounting the wafer on an x-y stage driven by piezoelectric or other transducers. The wafer includes a raised alignment mask on its upper surface. The wafer, mask membrane, and z piezoelectric tube are held rigidly but adjustably with respect to each other by a mechanical fixture. The z piezoelectric tube is lowered until it touches the cantilever; it is then lowered further by the designed gap spacing, deflecting the cantilever downward. The wafer is then raised until it is detected by the tip on the cantilever, either by sensing a tunneling current (STM) or a force (AFM). The wafer is now at the correct z gap setting, and is scanned back and forth in the x and y directions until the location of the alignment mark is determined by the cantilever tip following the contours of the alignment mark, thus setting the proper alignment between the wafer and the mask in the x, y direction.

5 Claims, 2 Drawing Sheets

X-RAY MASK CONTAINING A CANTILEVERED TIP FOR GAP CONTROL AND ALIGNMENT

BACKGROUND OF THE INVENTION

1. Field of the Invention

The present invention relates to apparatus for controlling the alignment and mask to wafer gap distance in an X-ray lithography machine, and more particularly to an alignment and gap control structure employing a cantilevered tip as an integral part of a mask.

2. Description of the Prior Art

U.S. Pat. No. 4,343,993, issued Aug. 10, 1982 to Binnig et al entitled SCANNING TUNNELING MICROSCOPE, disclosed a structure for the investigation of surface structures down to the atomic level. A sharply pointed, electrically conductive tip is placed at a distance on the order of one nanometer from the conductive surface of the sample to be investigated, with an appropriate potential applied across the gap between the tip and surface. As the electron clouds of the atoms at the apex of the tip and at the surface touch, a flow of electrons will result giving rise to a tunneling current which happens to be extremely sensitive to changes in gap width. To render these changes as close as possible to zero, a feedback system controls the distance of the tip from the surface, using the deviations of the tunnelling current from an initial value as a control signal. This control signal is also employed to generate a plot of the topography of the surface being investigated.

U.S. Pat. No. 4,359,892, issued Nov. 23, 1982 to Schnell et al entitled ARRANGEMENT FOR MEASURING SURFACE PROFILES, discloses a surface testing apparatus that includes a bilaminar ceramic flexure element provided with means for generating a voltage which is proportional to the deflection of the flexure element. This amplification is compared with a reference voltage. After amplification, the difference voltage is applied to the flexure element so that the applied force remains constant, independently of the deflection.

U.S. Pat. No. 3,876,879, issued Apr. 8, 1975 to McAdams et al and entitled METHOD AND APPARATUS FOR DETERMINING SURFACE CHARACTERISTICS INCORPORATING A SCANNING ELECTRON MICROSCOPE, discloses a method and apparatus for determining surface characteristics such as elevations of points on a surface wherein; an electron beam scans the surface causing electrons to be emitted from the surface; an electron sensitive detector develops signals in response to the emitted electrons impinging thereupon; a shield is located above the surface for blocking electrons emitted from an area of the surface from reaching the detector, the boundary of the area comprising a line that is a function of the elevation or contour of points on the surface, which line is sensed by the detector as a locus of points on the surface wherein the output of the detector abruptly changes in value.

U.S. Pat. No. 4,516,326, issued May 14, 1985 to Calcagno, Jr. entitled ELECTRONIC DEPTH GAGE, discloses an electromechanical device which uses a digital depth gage micrometer with a probe in combination with a read-out voltmeter to provide automatically recordable profiles of impacted crater sections. The circuit electrically connected to the voltmeter has a Zener circuit which transposes the mechanical movement of the probe to readable and recordable electronic signal information.

U.S. Pat. No. 4,560,880, issued Dec. 24, 1985 to Petric et al entitled APPARATUS FOR POSITIONING A WORKPIECE IN A LOCALIZED VACUUM PROCESSING SYSTEM, discloses apparatus for positioning a semiconductor wafer with respect to a localized vacuum envelope so as to maintain a prescribed gap between the tip of the vacuum envelope and the wafer includes an x-y table, a stage assembly moveable along the z-axis for holding the wafer and a z-axis actuator assembly. The z-axis actuator assembly includes a plurality of fluid-containing bellows coupled between the x-y table and the stage assembly and a hydraulic controller operated by a linear stepper motor for varying the fluid volume in each of the bellows in response to an actuator control signal so as to move the stage assembly along the z-axis. The z-axis actuator assembly can further include a flexible disk positioned in the plane of x-y movement and coupled between the x-y table and the stage assembly for preventing lateral and rotational movement of the stage assembly relative to the x-y table. The positioning apparatus is suitable for use in an electron beam lithography system.

U.S. Pat. No. 4,592,081, issued May 27, 1986 to Eaton et al entitled ADAPTIVE X-RAY LITHOGRAPHY MASK, describes an apparatus for improving alignment accuracy by distorting in a controlled manner an X-ray lithographic mask to compensate for mask distortions induced primarily by thermally induced clamping effects in E-beam and X-ray exposure systems. A system of additional alignment sensors is used to provide localized misalignment information. This information is then used to provide feedback to a servo system which in turn activates electromechanically translatable clamps which distort the X-ray mask so as to minimize misalignment over the exposure field.

U.S. Pat. No. 4,679,326, issued Jul. 14, 1987 to Takizawa et al entitled HEIGHT GAUGE, describes a height gauge that has a touch signal probe provided on a slider vertically movably supported on a support for the purpose of measuring the dimensions or the like of an object by bringing the probe into contact with the object. A rack is formed on the support, and a driving shaft is disposed on the slider, the driving shaft having a pinion engaged with the rack. To the driving shaft are secured a pulley to which the turning force from a motor is transmitted and a control wheel for manually rotating the driving shaft. A clutch member is interposed between the pulley and the control wheel. When the clutch member is engaged with the pulley, the slider is automatically moved up and down, while when the clutch member is engaged with the control wheel, the slider can be manually moved up and down. The height gauge further includes a control circuit which stops the drive of the motor when the touch signal probe generates a touch signal and which holds the indication of a measured value being displayed at that time.

U.S. Pat. Re. 33,387, issued Feb. 9, 1988 to Binnig entitled ATOMIC FORCE MICROSCOPE AND METHOD FOR IMAGING SURFACES WITH ATOMIC RESOLUTION, describes a system wherein a sharp point is brought close to the surface of a sample to be investigated so that the forces occurring between the atoms at the apex of the point and those at the surface cause a spring-like cantilever to deflect. The cantilever forms one electrode of a tunnelling microscope, the other electrode being a sharp tip. The deflection of the cantilever provokes a variation of the tunnel current, and that variation is used to generate a correction signal which can be employed to control the distance between said point and the sample, in order, for example, to maintain the force between them constant as the point is scanned across the surface of the sample by means of an xyz-drive.

U.S. Pat. No. 4,785,189, issued Nov. 15, 1988 to Wells entitled METHOD AND APPARATUS FOR LOW-ENERGY SCANNING ELECTRON BEAM LITHOGRAPHY, describes a system wherein an electron sensitive surface is patternized treated to a high resolution pattern of low-energy electrons without any need to do focussing by emitting the low-energy electrons from a pointed electrode and positioning the apex of the pointed electron emitting source suitably close to the surface being treated.

U.S. Pat. No. 4,806,755, issued Feb. 21, 1989 to Dverig et al and entitled MICROMECHANICAL ATOMIC FORCE SENSOR HEAD, describes a micromechanical sensor head designed to measure forces down to $10^{-13}$N. It comprises a common base from which a cantilever beam and a beam member extend in parallel. The cantilever beam carries a sharply pointed tip of a hard material, dielectric or not, for interaction with the surface of a sample to be investigated. Bulges forming a tunnelling junction protrude from facing surfaces of said beams, the gap between said bulges being adjustable by means of electrostatic forces generated by a potential ($V_d$) applied to a pair of electrodes respectively coated onto parallel surface of said beams. The sensor head consists of one single piece of semiconductor material, such as silicon or gallium arsenide (or any other compounds thereof) which is fabricated to the dimensions required for the application by means of conventional semiconductor chip manufacturing techniques.

U.S. Pat. No. 4,870,668, issued Sep. 26, 1989 to Frankel et al and entitled GAP SENSING/ADJUSTMENT APPARATUS AND METHOD FOR A LITHOGRAPHY MACHINE, discloses a step and repeat mechanism used with an X-ray lithography system for moving a wafer to be exposed from position to position beneath the source of X-rays. The step and repeat mechanism includes means for moving the wafer to be exposed with six degrees of freedom. Conventional drive motor means move the step and repeat mechanism, and wafer held thereby, in the X, Y and Z linear directions, as well as rotates, tip and tilt the wafer in the planar direction. In addition, the system includes three fine Z motor assemblies for moving the wafer in fine increments in the Z direction, which motor assemblies are used to tip and tilt the plane of the wafer. Sensors are included for determining the plane of the mask and the plane of each of the various sections of wafer to be exposed, so that appropriate tip and tilt adjustments by the three fine Z motor assemblies can be made to cause the average plane of each section of the wafer to be exposed to be parallel to the plane of the mask. All of the moving mechansism, with the exception of the Y direction moving mechanism, are affixed the same level of the step and repeat mechanism. Included in the mechanism is a substage plate which is adjusted by the three triangularly positioned fine Z motor assemblies.

U.S. Pat. No. 4,874,945, issued Oct. 17, 1989 to Ohi and entitled ELECTRON MICROSCOPE EQUIPPED WITH SCANNING TUNNELING MICROSCOPE, discloses an electron microscope equipped with a scanning tunneling microscope. The electron microscope comprises a holder, a scanning tunneling microscope scanner having a tip, and a shift mechanism. A sample is fixed inside the holder that is mounted between the upper pole piece and the lower pole piece of an objective lens. The shift mechanism moves the scanner in two directions parallel to the surface of the sample and in a direction vertical to the sample surface. The tip is poised above a desired portion of the sample by driving the shift mechanism while observing the tip and either a reflection electron microscope image or a transmission electron microscope image of the sample. Then, the scanner uses the tip to scan the sample surface to obtain a scanning tunneling microscope image.

U.S. Pat. No. 4,943,719, issued Jul. 24, 1990 to Akamine et al entitled MICROMINATURE CANTILEVER STYLES, discloses a technique wherein integral sharp tips on thin film cantilevers are produced by forming a rectangular silicon post on a silicon wafer. Etching the top of the post leaves sharp silicon tips at the corners of what remains of the silicon post. A silicon dioxide contilever with an integral tip is thermally grown over the silicon wafer and the sharp silicon tips.

SUMMARY OF THE INVENTION

An object of the present invention is to provide structures for precise alignment between a mask and a wafer in an X-ray lithography system.

Another object of the present invention is to provide structure for precise gap control between a mask and a wafer in an X-ray lithography system.

Still another object of the present invention is to provide alignment and gap control between a mask and a wafer in an X-ray lithography system using atomic force or scanning tunneling structures.

DESCRIPTION OF A PREFERRED EMBODIMENT

Figure 1:
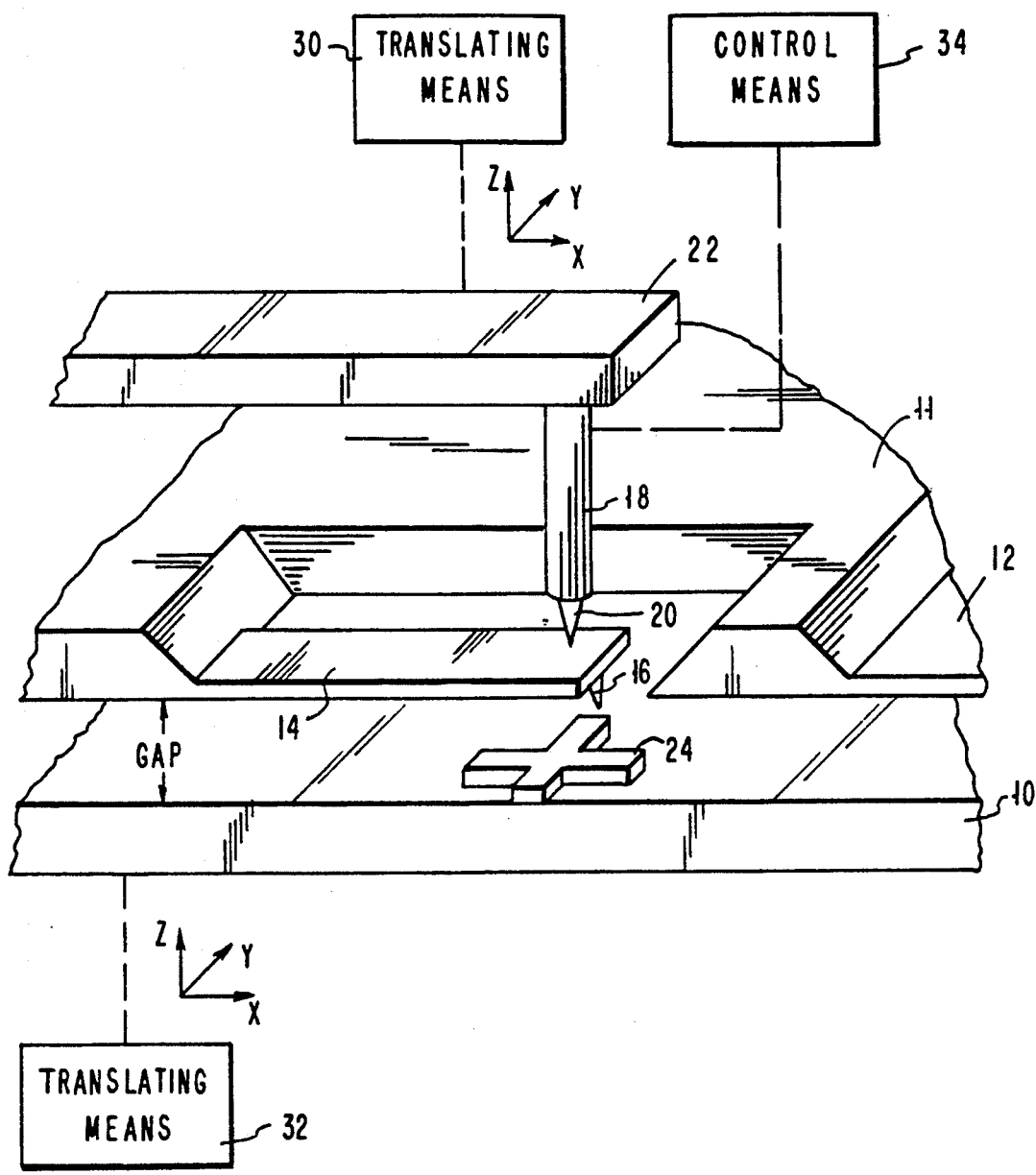
FIG. 1 is a cross-sectional perspective view of elements of an embodiment of an alignment and gap control structure for an X-ray lithographic system according to the principles of the present invention.

X-ray lithography is an important technology for the manufacture of deep submicron integrated circuits. The implementation of this technology is proximity printing, where an 1:1 X-ray mask is positioned 10 to 40 $\mu$m above the surface of the wafer. The mask and wafer are then exposed with a broad beam of X-rays, leaving an image of the mask in a radiation-sensitive film on the surface of the wafer. Such a process requires an alignment accuracy between the mask and wafer of a few tens of nanometers in order that multiple lithography levels precisely register. In addition, it requires careful control of the gap between the mask and the wafer because too large a gap will degrade the image due to diffraction effects and penumbral blurring, and too small of a gap increases the change of accidental touching and subsequent damage to the very delicate mask and/or wafer. In the prior art, alignment is achieved by shining light through the mask, which is usually made on a very thin, semitransparent membrane. The wafer is adjusted relative to the mask until corresponding marks on the mask and wafer properly coincide. However, due to limitations arising from the wavelength of visible light, it is difficult to achieve the required accuracy. Gap control is achieved by precise mechanical fixturing of the mask and wafer, which is difficult to control better than several micrometers; currently a gap of 40 μm is typically used.

The scanning tunneling microscope and the atomic force microscope are two closely related instruments that are both capable of achieving atomic resolution in the X, Y and Z dimensions. In the present invention, combinations of elements of these microscopes with X-ray masks are effectively used for mask to wafer alignment. The atomic force microscope is disclosed in U.S. Pat. No. Re.33,387 and the scanning tunneling microscope is disclosed in U.S. Pat. No. 4,343,993, both of which are cited in the Prior Art section herein.

The atomic force microscope also described by G. Binning, C. F. Quate and Ch. Gerber, Phys. Rev. Letters, Vol. 56, No. 9, March 1986, pp. 930–933, employs a sharply pointed tip attached to a spring-like cantilever beam to scan the profile of a surface to be investigated. At the distances involved, attractive or repulsive forces occur between the atoms at the apex of the tip and those at the surface, resulting in tinyl deflections of the cantilever beam. This deflection is measured by means of a tunneling microscope, i.e., an electrically conductive tunnel tip is placed within tunnel distance from the back of the cantilever beam, and the variations of the tunneling current are used to measure the deflection. With known characteristics of the cantilever beam, the forces occurring between the AFM tip and the surface under investigation can be determined.

The present invention proposes an atomic force microscope or scanning tunneling microscope comprising a pointed tip provided for interaction with a wafer and means for approaching said tip to said surface to within a distance on the order of one tenth of a nanometer, and for scanning said tip across said surface in a matrix fashion. This atomic force microscope is characterized in that said tip is attached to one surface of an oscillating body carrying, on opposite sides thereof, a pair of electrodes permitting an electrical potential to be applied, that, in operation and with said tip remote from said surface, said body is excited to oscillate at its resonance frequency, and that, with said tip maintained at said working distance from said surface, said body oscillates at a frequency deviating in a characteristic manner from said resonance frequency, that said deviation is compared with a reference signal, and that the resulting differential signal is passed through a feedback loop to control said means for approaching the tip to said surface.

The basic concept of a scanning tunneling microscope is to place a very sharp, conducting tip having tip dimensions on the order of the size of 1 atom in diameter close to a conductive surface. If the tip is brought very close to a conductive surface, i.e., within the space of the diameters of several atoms, (approximately within 5 angstroms), a tunneling current flows between the tip and the surface. That is, the probability density function of electrons for atoms in the tip overlaps in space the probability density function of electrons for atoms on the surface. As a result, tunneling occurs in the form of electron current flow between the tip and the surface if a suitable bias voltage between these two conductors is applied.

The feature of the present invention is that the capabilities of the atomic force microscope are used for X-ray mask gap control and alignment by making the cantilever element as an integral part of the X-ray mask being controlled and aligned. One or more apertures are formed in the mask, in the form of U-shaped slots, leaving a portion of the mask material which functions as the cantilever element. The operation of the cantilever element formed from the X-ray mask is in accordance with standard atomic force microscope or scanning tunneling microscope techniques as described in the prior art.

Referring to FIG. 1, a cross section of a perspective view of a wafer 10 and an X-ray mask substrate 11 with membrane 12 which contains a pattern to be transferred to the wafer 10 is illustrated in schematic form wherein a cantilever 14 and tip 16 portion such as used on an atomic force or scanning tunneling microscope are fabricated directly as part of the mask 11. The vertical (z) motion of the tip 16 with respect to the wafer 10 is achieved with a piezoelectric device 18 which is mounted on a movable support 22. Such a device could be a tube having an electrode divided into quadrants so that the end of the tube 20 could be positioned in three dimensions to allow for alignment of the end of the tube to the cantilever tip 16. X and Y motion of the tip 16 and the mask membrane 12 relative to the wafer 10 could be achieved by mounting the wafer 10 on an x-y stage driven by piezoelectric or other transducers. Moving wafers in lithography systems in the x, y and z directions in response to control signals is a technique well known to those skilled in the art. U.S. Pat. Nos. 4,560,880 and 4,870,668 discussed in the description of the prior art teach such systems. Thus, in FIG. 1, means 30 for translating device 18 in the x, y and z dimensions and means 32 for translating wafer 10 in the x, y and z dimensions are illustrated in very schematic form. Fabricating the cantilever element 16 requires only one or two additional processing steps since membrane technology is already used to fabricate the mask. Thus it is possible to fabricate the entire instrument directly onto the mask substrate 11 using multiple lithographic steps and piezoelectric thin film technology. The wafer 10 includes an alignment mark 24 as illustrated in FIG. 1.

Figure 2:
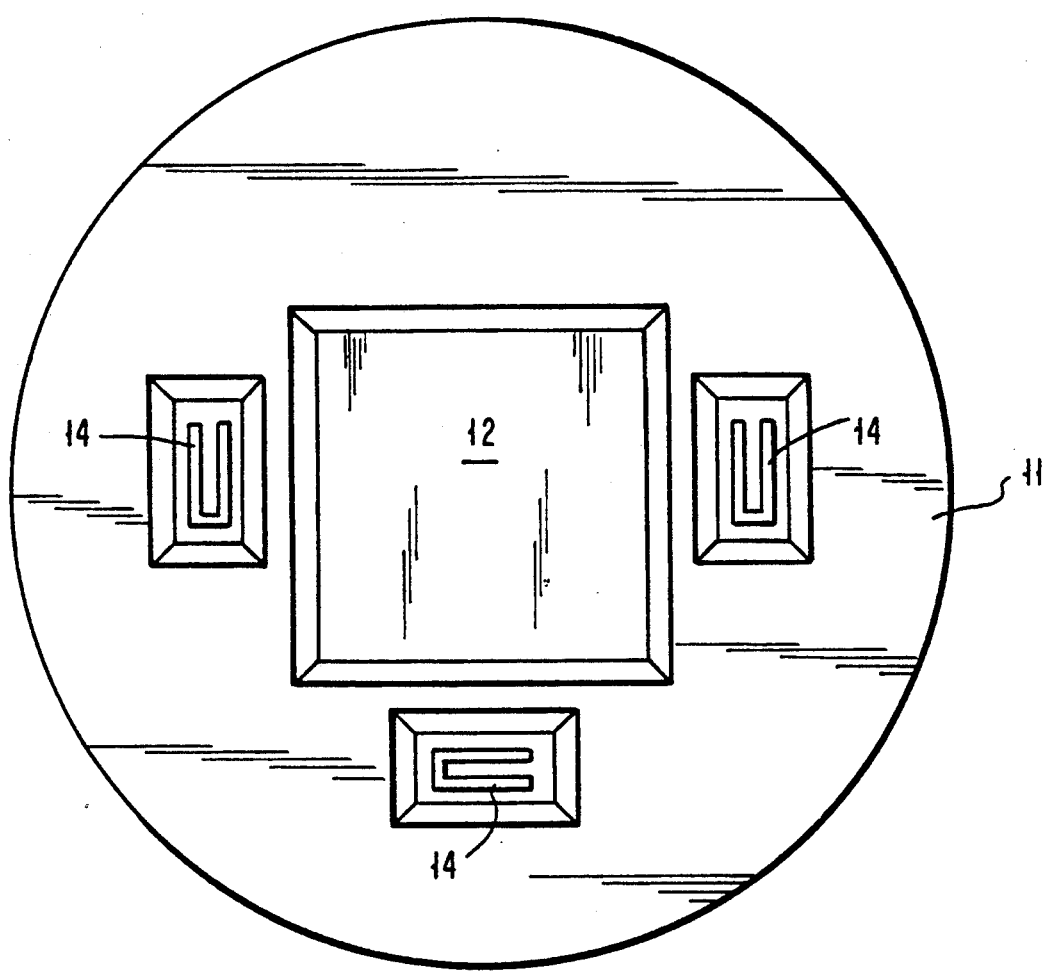
FIG. 2 is a schematic top view of the embodiment of an alignment and gap control structure on an X-ray lithographic system showing the arrangement of three of the elements of FIG. 1

In operation, the wafer 10, mask membrane 12, and z piezoelectric tube 18 are held rigidly but adjustably with respect to each other by a mechanical fixture (not shown). The z piezoelectric tube 18 is lowered until tip 20 touches cantilever 14; it is then lowered further by the designed gap spacing, deflecting the cantilever 14 downward. The wafer 10 is then raised until it is detected by the tip 16 on the cantilever 14, either by sensing a tunneling current (STM) or a force (ATM). The wafer 10 is now at the correct z gap setting, and is scanned back and forth in the x and y directions until the location of the alignment mark 24 is determined by the cantilever tip 16 following the contours of the alignment mark 24, thus setting the proper alignment between the wafer and the mask in the x, y direction. The wafer 10 is first exposed by a mask which has alignment marks in place of the cantilevers. The pattern is transferred as a relief on the wafer surface for subsequent mark detection. The remaining masks would have three cantilevers located around the edge of the exposure field in order to align the wafer in all six degrees of freedom, as shown in FIG. 2. Spare cantilever locations could be provided in case any were damaged or broken. Deviations of the ends of the cantilevers from their design locations could be mapped out by measuring the alignment accuracy of test exposures.

Having thus described our invention what we claim as new and desire to secure as Letters Patent, is:

1. A structure for providing precise alignment in the x,y dimensions and precise gap control in the z dimension between a mask and a wafer in a lithography system comprising:

a wafer to be lithographically exposed to radiation having a raised alignment mark on the upper surface thereof, a mask disposed over said wafer, said mask having radiation transparent areas for permitting radiation to strike said wafer in predetermined patterns, said mask having at least one physical opening therein including a cantilever member portion of said mask material projecting from an edge of said mask opening into said opening, said cantilever member being constrained only at one end at said edge of said opening and being free to move in the Z dimension at the end opposite said edge of said opening, a tip affixed to the said opposite end of said projecting cantilever position of said mask material, gap control means, including a tip, disposed vertically in the Z dimension over said opposite end of said projecting cantilever, said gap control means further including means for moving said tip into contact with said projecting cantilever for bending said cantilever down toward said wafer in Z dimension to a predetermined gap spacing distance, means for raising said wafer upward in the Z dimension until substantially proximate said tip on said projecting cantilever, and means for translating said wafer in the X and Y dimensions until said sharp tip on said projecting cantilever is in contact with said alignment mark.

2. A structure according to claim 1 wherein said cantilever member is composed of said mask material and is contiguous with said mask at said constrained end.

3. A structure according to claim 2 wherein said radiation transparent areas are thin membrane areas of said mask having thicknesses significantly less than the thickness of said mask such that radiation passes through said membrane areas and is blocked by said thicker mask.

4. A structure according to claim 2 wherein said radiation is a beam of X-rays.

5. A structure according to claim 2 wherein said gap control means includes a piezoelectric transducer.

* * * * *